(12) United States Patent
Thorp et al.

(10) Patent No.: US 8,004,919 B2
(45) Date of Patent: Aug. 23, 2011

(54) METHODS AND APPARATUS FOR EXTENDING THE EFFECTIVE THERMAL OPERATING RANGE OF A MEMORY

(75) Inventors: Tyler J. Thorp, Palo Alto, CA (US); Roy E. Scheuerlein, Cupertino, CA (US)

(73) Assignee: SanDisk 3D LLC, Milpitas, CA (US)

(*) Notice: Subject to any disclaimer, the term of this patent is extended or adjusted under 35 U.S.C. 154(b) by 0 days.

(21) Appl. No.: 12/828,846

(22) Filed: Jul. 1, 2010

(65) Prior Publication Data

US 2010/0271894 A1 Oct. 28, 2010

Related U.S. Application Data

(63) Continuation of application No. 11/772,097, filed on Jun. 29, 2007, now Pat. No. 7,773,446.

(51) Int. Cl.
G11C 7/04 (2006.01)

(52) U.S. Cl. .................... 365/211; 365/163; 365/177

(58) Field of Classification Search .................. 365/211, 365/163, 177
See application file for complete search history.

(56) References Cited

U.S. PATENT DOCUMENTS

| | | | |
|---|---|---|---|
| 4,646,266 A | 2/1987 | Ovshinsky | |
| 4,899,180 A | 2/1990 | Elhatem et al. | |
| 5,177,453 A * | 1/1993 | Russell et al. | 330/284 |
| 5,659,270 A | 8/1997 | Millen et al. | |
| 5,751,012 A | 5/1998 | Wolstenholme | |
| 5,835,396 A | 11/1998 | Zhang | |
| 6,034,882 A | 3/2000 | Johnson | |
| 6,055,180 A | 4/2000 | Gudesen | |
| 6,185,122 B1 | 2/2001 | Johnson et al. | |
| 6,373,768 B2 | 4/2002 | Woo et al. | |
| 6,420,215 B1 | 7/2002 | Knall | |
| 6,618,295 B2 | 9/2003 | Scheuerlein | |
| 6,631,085 B2 | 10/2003 | Kleveland | |
| 6,888,750 B2 | 5/2005 | Walker et al. | |
| 7,081,377 B2 | 7/2006 | Cleeves | |
| 7,106,652 B2 | 9/2006 | Scheuerlein | |
| 7,148,763 B2 * | 12/2006 | Sutardja | 331/176 |
| 7,173,407 B2 | 2/2007 | Marinca | |
| 7,233,024 B2 | 6/2007 | Scheuerlein | |
| 7,403,423 B2 | 7/2008 | Marotta et al. | |
| 7,450,456 B2 | 11/2008 | Jain et al. | |
| 7,504,051 B2 | 3/2009 | Sen | |
| 7,646,627 B2 * | 1/2010 | Hidaka | 365/158 |
| 7,656,734 B2 | 2/2010 | Thorp et al. | |
| 7,812,404 B2 * | 10/2010 | Herner et al. | 257/390 |
| 2007/0114508 A1 | 5/2007 | Herner | |

(Continued)

OTHER PUBLICATIONS

Braun et al., "On-Chip Temperature Control Circuit Using Common Devices", 2005, IEEE 2005 Custom Integrated Circuits Conference, pp. 215-218.

(Continued)

*Primary Examiner* — Son T Dinh
*Assistant Examiner* — Nam T Nguyen
(74) *Attorney, Agent, or Firm* — Dugan & Dugan, PC

(57) ABSTRACT

Apparatus and systems are provided for thermal regulation of a memory integrated circuit ("IC"). The apparatus and systems may include a thermal sensor on a memory IC, and a heating element coupled to the thermal sensor. The heating element is adapted to heat the memory IC in response to a signal from the thermal sensor. Other aspects are also provided.

13 Claims, 5 Drawing Sheets

U.S. PATENT DOCUMENTS

2009/0003109 A1    1/2009    Thorp et al.

OTHER PUBLICATIONS

Office Action of U.S. Appl. No. 11/772,103 mailed Jun. 18, 2009.
Office Action of U.S. Appl. No. 11/772,097 mailed May 26, 2009.
Aug. 26, 2009 Reply to May 26, 2009 Office Action of U.S. Appl. No. 11/772,097.
Aug. 26, 2009 Reply to Jun. 18, 2009 Office Action of U.S. Appl. No. 11/772,103.
Notice of Allowance of U.S. Appl. No. 11/772,103 mailed Sep. 30, 2009.
Supplemental Notice of Allowance of U.S. Appl. No. 11/772,103 mailed Dec. 1, 2009.
Notice of Allowance of U.S. Appl. No. 11/772,097 mailed Dec. 15, 2009.
Knall, N. Johan, U.S. Appl. No. 09/560,626, filed Apr. 28, 2000.
Johnson, Mark G., U.S. Appl. No. 09/638,428, filed Aug. 14, 2000.
Naji et al., "A 256 kb 3.0V 1T1MTJ Nonvolatile Magnetoresistive RAM", Feb. 6, 2001, Digest of Technical Papers of the 2001 IEEE International Solid-State Circuits Conference, ISSCC 2001/Session 7/Technology Directions: Advanced Technologies/7.6, pp. 122-123, 438.
Naji et al., "A 256 kb 3.0V 1T1MTJ Nonvolatile Magnetoresistive RAM", ISSCC 2001 Visuals Supplement, Session 7/Technology Directions: Advanced Technologies/7.6, pp. 94-95 and 404-405.
Notice of Allowance of U.S. Appl. No. 11/772,097 mailed Apr. 2, 2010.
Comments on Reasons for Allowance of U.S. Appl. No. 11/772,097 mailed Apr. 15, 2010.

* cited by examiner

METHODS AND APPARATUS FOR EXTENDING THE EFFECTIVE THERMAL OPERATING RANGE OF A MEMORY

REFERENCE TO RELATED APPLICATIONS

This application is a continuation of U.S. patent application Ser. No. 11/772,097, filed Jun. 29, 2007, titled "METHODS AND APPARATUS FOR EXTENDING THE EFFECTIVE THERMAL OPERATING RANGE OF A MEMORY," now U.S. Pat. No. 7,773,446, which is incorporated by reference herein in its entirety.

BACKGROUND

The present application relates to memories, and more specifically, the present invention relates to extending the thermal operating range of memories.

Memories used to store computer data may need to be used in environments that may not be suitable for the operation of electronic circuits. In particular, below certain thermal thresholds, electronic circuits may not function properly. Thus, what is needed are systems and methods for extending the thermal operating range of memories.

SUMMARY

Apparatus and systems in accordance with this invention are provided for thermal regulation of a memory integrated circuit ("IC"). In a first aspect of the invention, apparatus are provided that include a thermal sensor on a memory IC, and a heating element coupled to the thermal sensor. The heating element is adapted to heat the memory IC in response to a signal from the thermal sensor.

In a second aspect of the invention, a system is provided that includes a non-volatile memory array on an IC. A thermal regulation circuit is integrated on the IC, and is adapted to maintain the memory array at a predefined threshold temperature.

In a third aspect of the invention, apparatus for thermal regulation of a non-volatile three dimensional memory IC are provided. The apparatus include a current output temperature sensor integrated into a non-volatile three dimensional memory IC, and a resistive heating element coupled to the current output temperature sensor. The resistive heating element is adapted to heat the memory IC in response to a signal from the current output temperature sensor indicating that the memory IC is at a temperature below a desired threshold temperature.

In a fourth aspect of the invention, a memory IC is provided that includes a control circuit and a heating element. The control circuit provides a first output signal when a temperature of the memory IC is above a predetermined temperature, and a second output signal when the temperature of the memory IC is below the predetermined temperature. The heating element is adapted to heat the memory IC when the control circuit provides the second output signal.

Other features and aspects of the invention will become more fully apparent from the following detailed description of exemplary embodiments, the appended claims and the accompanying drawings.

DETAILED DESCRIPTION

The present invention provides systems and methods for selectively employing on-chip heating elements to extend the thermal operating range of memory integrated circuits, and in particular embodiments, the thermal operating range of non-volatile memories (e.g., non-volatile memory in a USB drive or a compact flash drive). The heating elements may be physically distributed on the memory IC and may be selectively controlled by one or more circuits adapted to receive feedback from thermal sensors that are also distributed on the memory IC. In some embodiments, the heating elements may include resistors or other components adapted to convert electrical energy into thermal energy. Likewise, temperature sensing elements such as temperature transducers (e.g., thermocouples, resistance temperature devices ("RTDs"), thermistors, semiconductor temperature sensors, etc.) may be adapted to convert detected thermal energy into an electrical control signal that activates the heating elements on the IC. As indicated above, the present invention effectively extends the lower thermal operating range of non-volatile memories by heating the memory elements to a operating temperature wherein the memory elements operate reliably. In particular, diodes used in non-volatile memories may be sensitive to low temperatures and the present invention may be particularly useful in compensating for diode characteristics over low temperature ranges.

In some embodiments, the present invention may be used to help overcome or correct certain error conditions. In particular, for example in low power applications, it may not be desirable, necessary, or possible to employ heating elements in a continuous manner. Therefore, in some embodiments, the use of integrated heating elements may be initiated only upon detection of an error condition and/or the availability of unlimited power (e.g., when the memory is used with a line power supply as opposed to a battery power supply). For example, temperature regulation may be employed (e.g., using the heating elements) when a number of read errors exceeds a predefined threshold or during an effort to recover from a "non-correctable" error. By limiting the use of temperature regulation using integrated, on-chip heating elements to error condition recovery and/or error avoidance, power consumption may be conserved and thereby the present invention may facilitate improving memory robustness, particularly in low power and low temperature applications.

Figure 1:
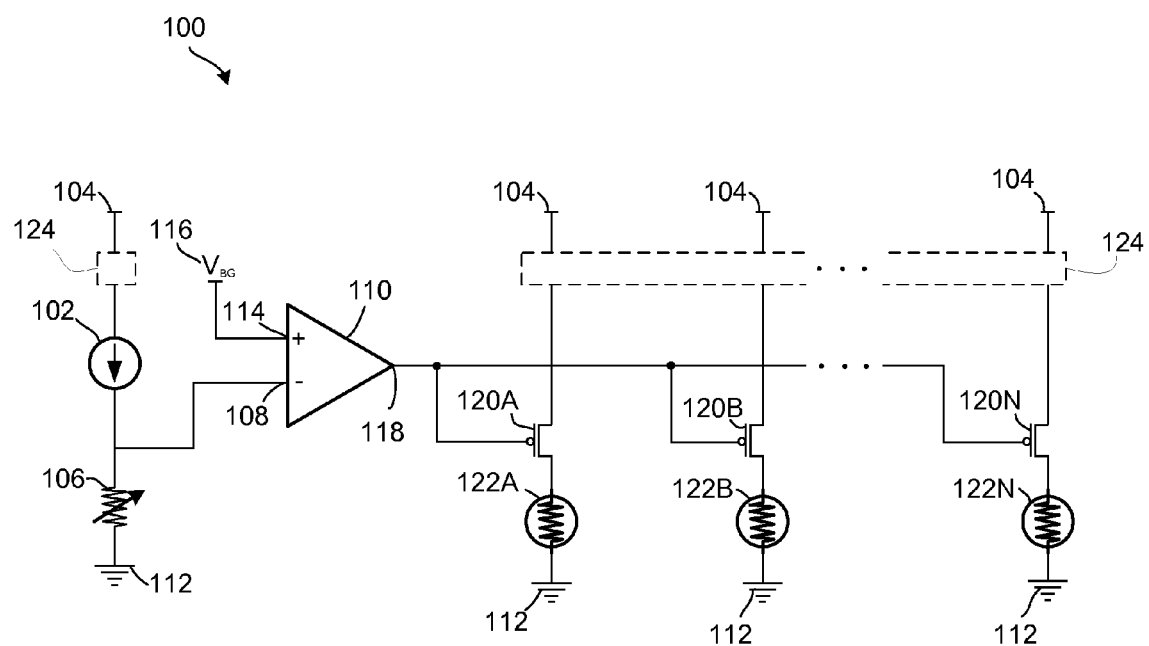
FIG. 1 is a schematic diagram depicting an example circuit operative to maintain a minimum temperature on a memory chip according to some embodiments of the present invention.

Turning now to FIG. 1, an example circuit 100 that embodies the present invention is depicted. The circuit 100 includes a current output temperature sensor 102 that has a V+ terminal coupled to a supply voltage 104 and the V− terminal coupled to both of a first end of a variable resistor 106 and the (−) terminal 108 of an operational amplifier 110. The second end of the variable resistor 106 is coupled to ground 112. The (+) terminal 114 of the operational amplifier 110 is coupled to a band gap voltage reference $V_{BG}$ 116. The output 118 of the operational amplifier 110 is coupled to each of the gates of transistors 120A, 120B, . . . , 120N. The sources of the transistors 120A, 120B, . . . , 120N are each coupled to supply voltage 104 and the drains of the transistors 120A, 120B, ..., 120N are each coupled to resistive heating elements 122A, 122B, ..., 122N, respectively, which are each coupled to ground 112.

In operation, variable resistor 106 is calibrated to a predefined setting that corresponds to a desired threshold temperature. For example, a resistance may be selected so that a voltage that is above the band gap voltage reference $V_{BG}$ 116 is applied to the (−) terminal 108 whenever the current output temperature sensor 102 outputs a current indicating the sensed temperature is below 55° C. and so that a voltage that is below the band gap voltage reference $V_{BG}$ 116 is applied to the (−) terminal 108 whenever the current output temperature sensor 102 outputs a signal indicating the sensed temperature is above 55° C. Thus, in this example, the output 118 biases the gates of transistors 120A, 120B, ..., 120N on if the voltage applied to the (−) terminal 108 is above the band gap voltage reference $V_{BG}$ 116, indicating that the current output temperature sensor 102 is detecting a temperature less than 55° C. Once the gates of transistors 120A, 120B, ..., 120N are biased on, current flows through the transistors 120A, 120B, ..., 120N to the respective resistive heating elements 122A, 122B, ..., 122N which generate heat until the current output temperature sensor 102 detects that the IC is at a temperature above 55° C. at which point the output of the temperature sensor 102 causes the voltage applied to the (−) terminal 108 of the operational amplifier 110 to fall below the band gap voltage reference $V_{BG}$ 116 which results in the operational amplifier 110 removing the on bias from the gates of transistors 120A, 120B, ..., 120N and the respective resistive heating elements 122A, 122B, ..., 122N being shut down. Thus, negative feedback is achieved via the thermal transfer from the resistive heating elements 122A, 122B, ..., 122N to the current output temperature sensor 102.

The example circuit 100 depicts three or more resistive heating elements 122A, 122B, ..., 122N being controlled by a single current output temperature sensor 102. Many more heating elements may be included. In some embodiments, many current output temperature sensors distributed across the memory IC may be employed. Such an embodiment facilitates accurate measurement and regulation of different parts of the IC. In addition, in some embodiments, only one or two heating elements may be coupled to a temperature sensor. In embodiments where the operating temperature of 3D memory is being regulated, the heating elements and the temperature sensors may be distributed on the same and/or different planes of the memory arrays.

The example circuit 100 described above used a current output temperature sensor as a thermal transducer. However, one of ordinary skill would recognize that many other alternative types of temperature sensors could be used. For example, voltage output sensors, Brokaw cells, bi-polar junction transistor ("BJT") based temperature sensors, and discrete sensors such as thermocouples, RTDs, and thermistors. Likewise, alternative heating elements may be employed.

In some embodiments, additional circuitry may be employed to further control the example circuit 100 described above. For example, an enable/disable function 124 (shown in phantom) may be implemented that allows the circuit 100 to be enabled or disabled based on any desired criteria. For example, the temperature sensors 102, the operational amplifier 110, and/or the heating elements 122A-N may not be powered (e.g., voltage supply 104 may be disconnected) to disable the circuit 100 and the temperature sensors 102, the operational amplifier 110, and/or the heating elements 122A-N may be powered (e.g., voltage supply 104 may be connected) to enable the circuit 100. The criteria for enabling or disabling may be implemented in a logic circuit or via a software programmable controller. Examples of the criteria may include whether the memory circuit is to operate in a low power mode and thus, thermal regulation should be disabled; whether the memory circuit is powered by a line power supply and thus, thermal regulation may be enabled; whether an error recovery mode has been initiated and thus, thermal regulation should be enabled; whether a threshold number of read errors has been detected and thus, thermal regulation should be enabled, etc. In some embodiments, control of the enable/disable function 124 may, for example, be implemented as a bit value in a configuration register and/or as a transistor switch operative to connect/disconnect the voltage supply 104 to the circuit 100. Because the heating elements may take time, for example, 10 or more microseconds, to bring the IC into the desired thermal operating range, the circuit 100 may also include a memory access delay indicator that may be used to delay memory access until the desired thermal operating range is achieved. Alternatively, upon activating the circuit 100 or a corresponding error recovery/safe mode, the host system accessing the memory may simply wait a predefined amount of time before attempting to make the memory access.

The present invention allows memories to be designed to operate within a less wide thermal range than is conventional. In other words, diodes capable of operating over a broad thermal range such as −25° C. to 105° C. may no longer be required for non-volatile memory applications that employ the present invention. For example, a memory employing the temperature regulating circuit 100 described above may only need to be designed to function in the thermal operating range of 55° C. to 105° C. as opposed to the conventional range of −25° C. to 105° C.

Figure 2:
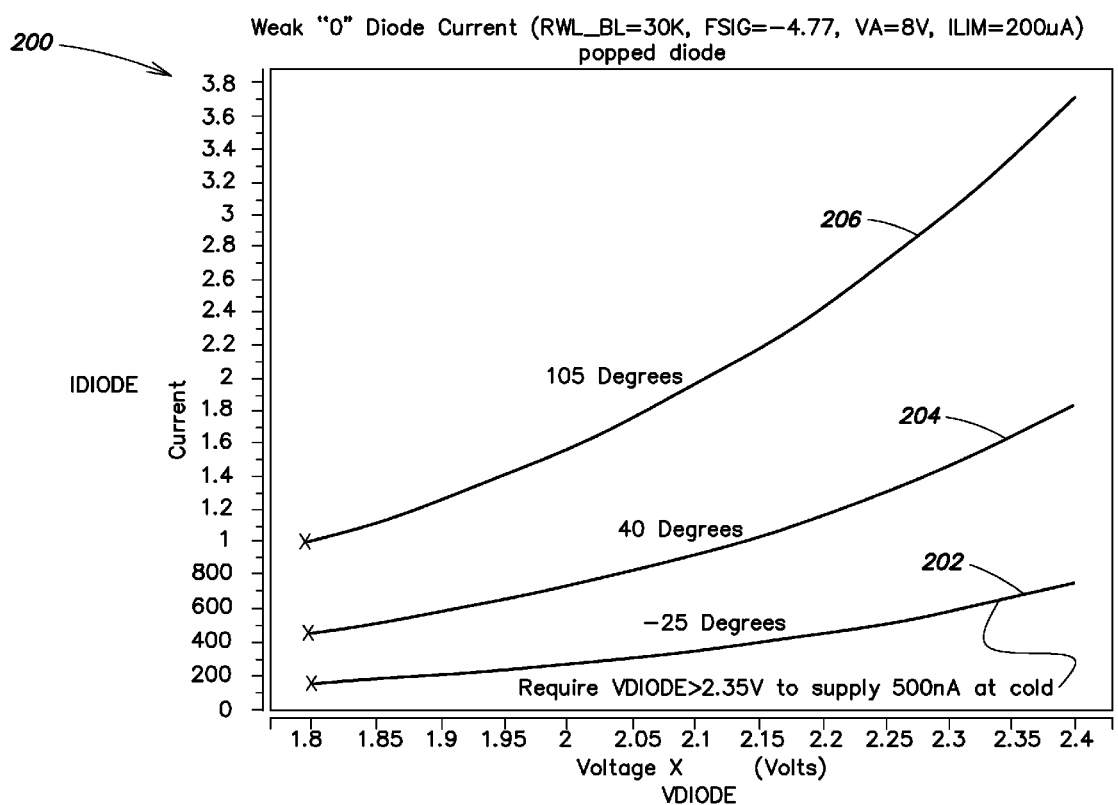
FIG. 2 is a graph illustrating example diode performance curves at different temperature levels.

Turning to FIG. 2, a graph 200 illustrating examples if diode performance curves 202, 204, 206 at different temperature levels (e.g., −25° C., 40° C., 105° C., respectively) is provided. These diode performance curves 202, 204, 206 may be typical of diodes used in non-volatile memory cells. In the example circuit 100 described above with respect to FIG. 1, 55° C. was selected as the threshold temperature below which the heating elements 122A, 122B, ..., 122N were activated. Based on extrapolation, the graph 200 of FIG. 2 indicates that the example characterized diodes would perform acceptably at 55° C. in a non-volatile memory application. It should be understood however that the example circuit 100 described above may be adapted to operate a different threshold temperatures so that any of the diode performance curves 202, 204, 206 may be selected.

Figure 3:
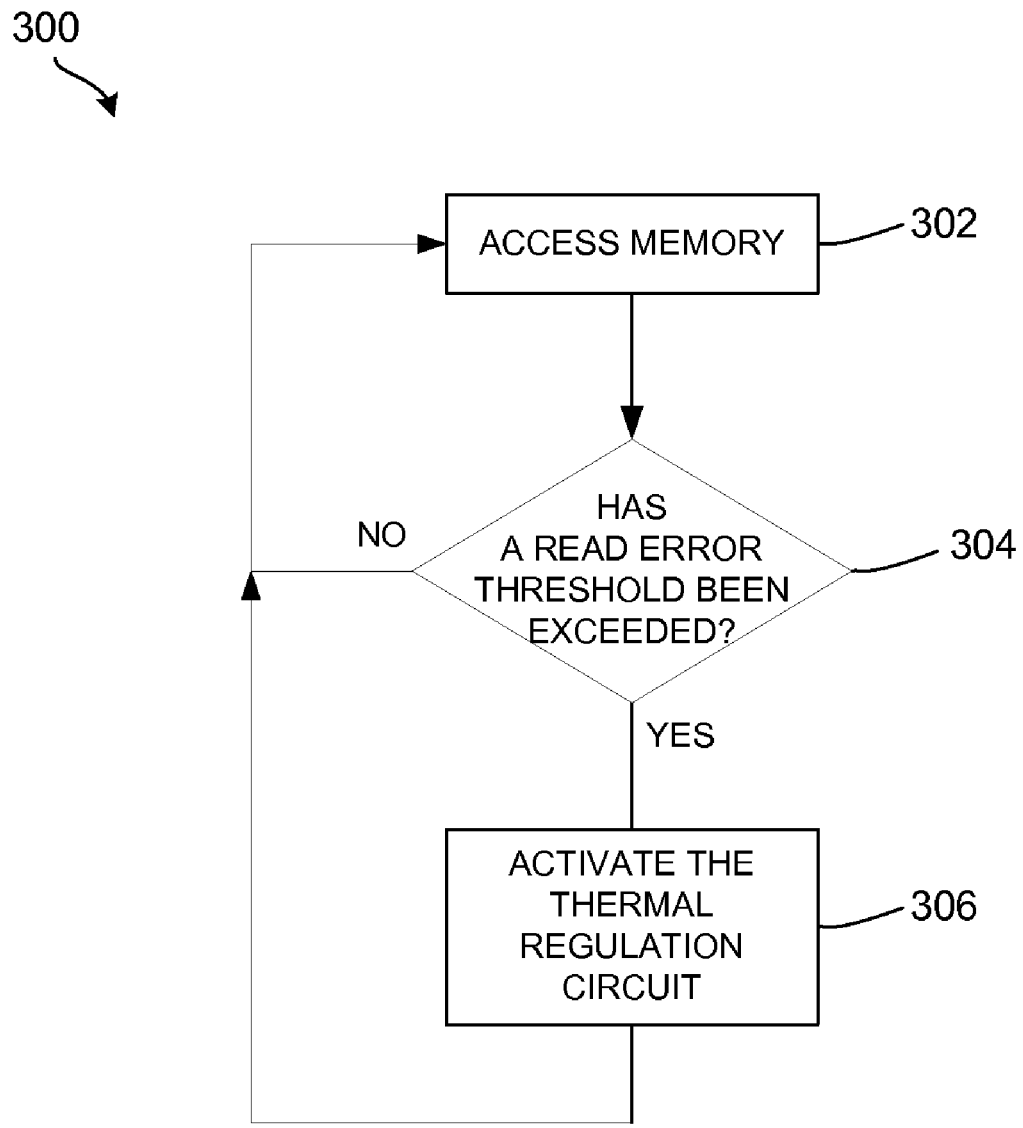
FIG. 3 is a flowchart depicting a first example method according to some embodiments of the present invention.
Figure 4:
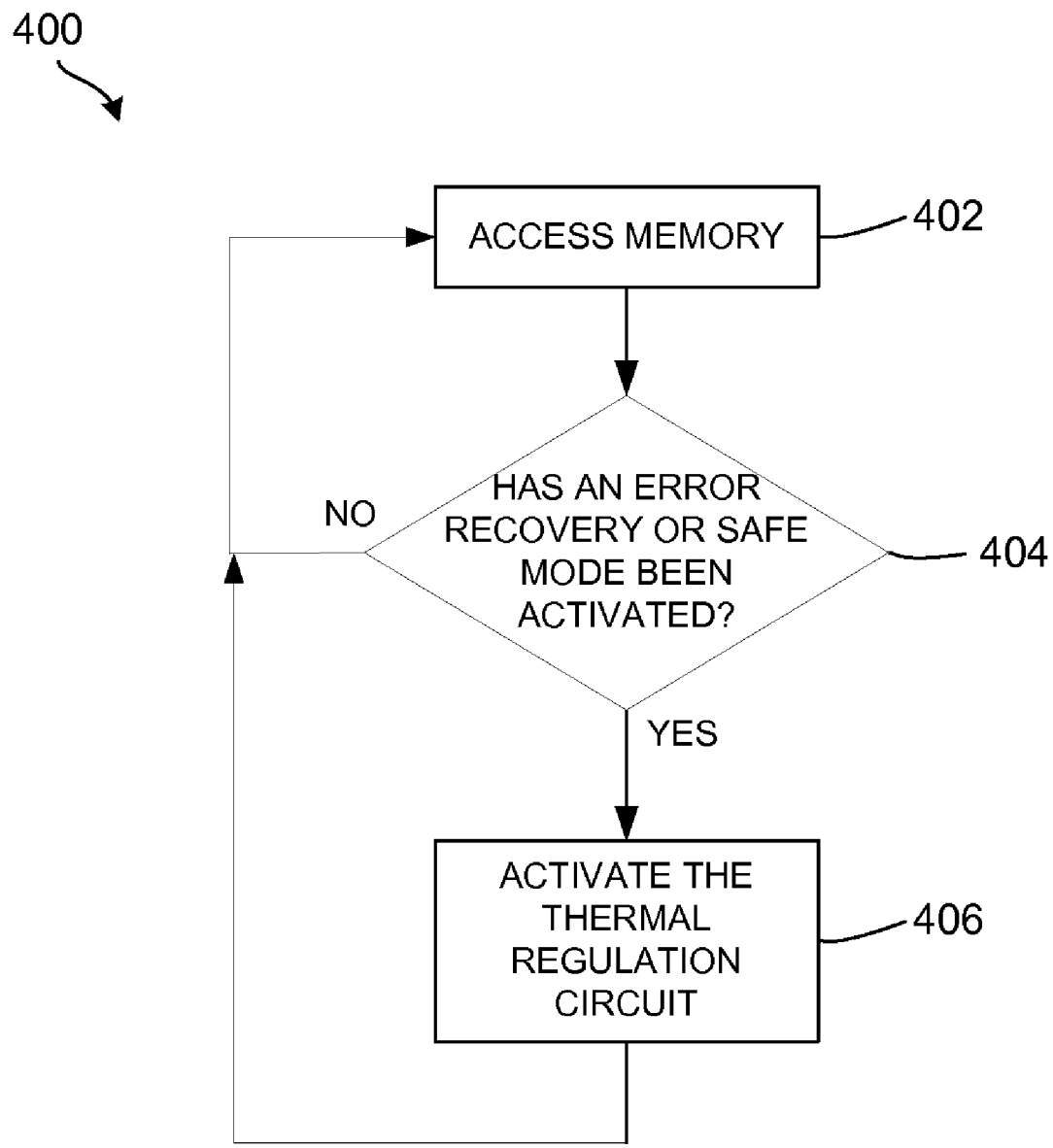
FIG. 4 is a flowchart depicting a first example method according to some embodiments of the present invention.
Figure 5:
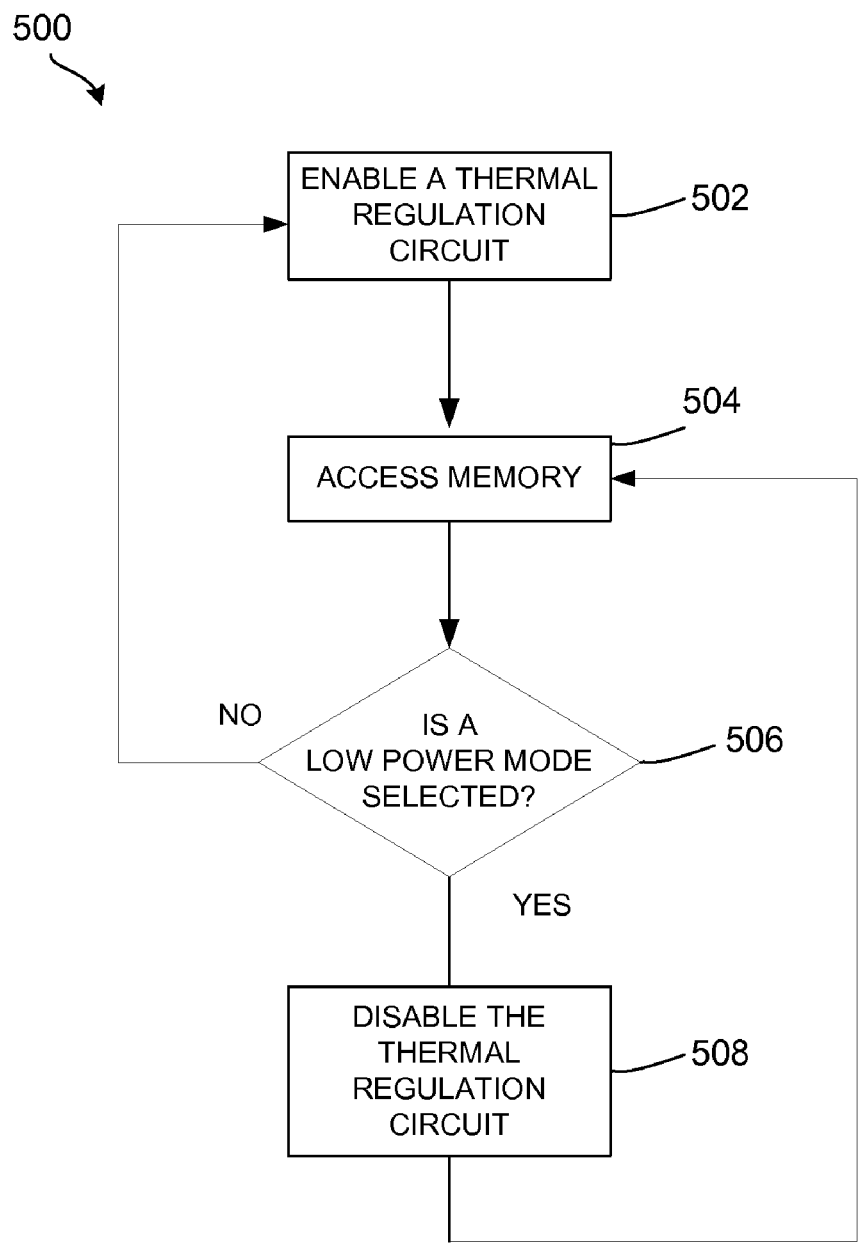
FIG. 5 is a flowchart depicting a first example method according to some embodiments of the present invention.

Turning to FIGS. 3 to 5, flowcharts illustrating example methods of the invention, including methods of using the example circuit 100 of the present invention, are described. Although specific numbers of steps are depicted in each flow chart, it should be understood that any number of steps may be employed to embody the present invention and that many additional and/or alternative steps, sub-steps, and/or compound steps may be used. In addition, the particular order of the steps depicted is merely illustrative of a possible order and it should be understood that many alternative orders of performing the steps are practicable. Finally, the various example methods may be combined into any practicable combination of methods.

In FIG. 3, a first example method 300 is depicted wherein thermal regulation (e.g., in the form of a thermal regulation circuit 100 described above) is employed if a threshold number of read errors is detected. In Step 302, memory (e.g., non-volatile memory in a USB drive or a compact flash drive) is accessed. In step 304, a determination is made whether a threshold number of errors, for example read errors, has been exceeded as a result of accessing the memory. This determination may be made based upon an error counter included in the memory circuit or by a host system accessing the memory circuit. The threshold number of errors may be a predefined number based on an expected performance of the memory, based on an acceptable rate of error for the memory design, and/or based on other factors. The errors may be detected (and corrected) through the use of well know error correction circuits ("ECC") that are part of the memory circuit. If the number of errors does exceed the threshold, then in Step 306, thermal regulation may be enabled and memory access may continue by returning to Step 302. Otherwise, memory access may continue as before by returning to directly Step 302. In some embodiments, the memory access may be retried after thermal regulation is enabled in Step 306. In such a case, a delay may be introduced in Step 306, to allow the thermal regulation to become active before the retry attempt. Alternatively, ECC may be used to recover from the error and the activation of thermal regulation may be simply to reduce the possibility of errors in future memory accesses. In this case, the memory may be said to be operating in an error avoidance mode.

In FIG. 4, a second example method 400 is depicted wherein thermal regulation (e.g., in the form of using a thermal regulation circuit 100 described above) is employed if an error recovery mode or a safe mode has been activated. In some circumstances, ECC or other error detection and correction systems may be unable to correct detected errors. For example, if too many bits in an ECC set are corrupted, the ECC algorithm may be unable to determine which bits are corrupt and/or what the correct values should be. In such cases, thermal regulation may be used to attempt to recover the lost information. In Step 402, memory (e.g., non-volatile memory in a USB drive or a compact flash drive) is accessed. In step 404, a determination is made whether an uncorrectable error has occurred and whether the memory system and/or the host wants to enter an error correction or "safe" mode. A safe mode may be defined as a most reliable mode of operation, possibly achieved at the expense of performance, increased power consumption, and/or other cost. This determination may be made based upon an ECC included in the memory circuit or by a host system accessing the memory circuit. The error condition may be a predefined condition based on an expected performance of the memory, based on an acceptable rate of error for the memory design, and/or based on other factors. If an error recovery mode is to be activated, then in Step 406, thermal regulation may be enabled and memory access may be retried by returning to Step 402. Otherwise, memory access may continue as before by returning to directly Step 402. In some embodiments, a delay may be introduced in Step 406, to allow the thermal regulation to become active (e.g., a time delay to warm up the memory IC) before the retry attempt.

Turning to FIG. 5, a third example method 500 is depicted wherein thermal regulation (e.g., in the form of using a thermal regulation circuit 100 described above) is employed if power consumption is not an issue (e.g., operating on line power) and disabled if a low power application (e.g., operating on battery power) is required. In Step 502, thermal regulation is enabled. In some embodiments, a delay may be introduced in Step 502, to allow the thermal regulation to become active (e.g., a time delay to warm up the memory IC) before memory is accessed. In Step 504, memory (e.g., non-volatile memory in a USB drive or a compact flash drive) is accessed. In Step 506, a determination whether a low power consumption mode has been selected. For example, the memory system or host may determine or indicate that the memory is operating on battery power which results in a low power consumption mode being selected. If a low power consumption mode has been selected, then, in Step 508, thermal regulation is disabled and flow returns to Step 504 for memory access. If a low power consumption mode has not been selected, then, in Step 502, thermal regulation remains disabled and additional memory accesses occur in Step 504.

While the invention has been largely described with respect to the embodiments set forth above, the invention is not necessarily limited to such embodiments. For example, the instant invention can also be applied to three-dimensional memory arrays configured as a plurality of levels or planes, where word lines and/or bit lines are shared between levels, including, but not limited to: (1) the memory described in Johnson et al. U.S. Pat. No. 6,034,882, and Johnson et al. U.S. Pat. No. 6,185,122, both commonly assigned herewith; (2) the memory array described in U.S. patent application Ser. No. 09/560,626 filed on Apr. 28, 2000, and commonly assigned herewith; (3) the memory array described in Knall et al. U.S. Pat. No. 6,420,215, commonly assigned herewith; (4) the memory described in Kleveland et al. U.S. Pat. No. 6,631,085; (5) the memory described in Scheuerlein U.S. Pat. No. 7,106,652 (and related applications); and (6) the memory described in Cleeves U.S. Pat. No. 7,081,377, each of which is hereby incorporated herein by reference. The example temperature regulation circuit 100, or other functionally equivalent circuits, may be distributed on different levels within the three-dimensional memory. In some embodiments, for example, a plurality of heating elements, each coupled to and controlled by a single temperature sensor, may be distributed among multiple levels within the three-dimensional memory. In some embodiments, multiple sensors may control one or more heating elements on the same or different levels of the three-dimensional memory.

As used herein, the term passive element memory array ("PEMA") may include a plurality of two-terminal memory cells, each connected between an associated X-line and an associated Y-line. Such a memory array may be a two-dimensional (planar) array or may be a three-dimensional array having more than one plane of memory cells. Each such memory cell may have a non-linear conductivity in which the current in a reverse direction (e.g., from cathode to anode) is less than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (e.g., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain embodiments of the present invention, the memory element is a diode-like structure having a p+ region separated from an n− region by an antifuse element. When the antifuse element is programmed, the p+ region is electrically connected to the n− region and forms a diode. The programming state of the memory element may be read by sensing current flow or a voltage drop when the memory element is selected. In an organic passive element memory cell array embodiment, the memory element is a diode-like structure having an anode region separated from a cathode region by an organic material layer whose conductivity changes as electrons are injected into the layer. PEMAs are further described in Scheuerlein et al. U.S. Pat. No. 7,233,024, which is hereby incorporated herein in its entirety.

The memory cells are comprised of semiconductor materials, as described in Johnson et al. U.S. Pat. No. 6,034,882, Zhang U.S. Pat. No. 5,835,396, Knall U.S. patent application Ser. No. 09/560,626, and Johnson U.S. patent application Ser. No. 09/638,428, each of which are hereby incorporated by reference. Specifically an antifuse memory cell is preferred. Other types of memory arrays that are stackable over support circuits, such as magnetoresistive random access memory ("MRAM") and organic passive element arrays, can also be used. MRAM is based on magnetic memory elements, such as a magnetic tunnel junction ("MTJ"). MRAM technology is described in Peter K. Naji et al., "A 2556 kb 3.0V 1T1MTJ Nonvolatile Magnetoresistive RAM," published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated herein by reference. Certain passive element memory cells that incorporate layers of organic materials including at least one layer that has a diode-like characteristic conduction and at least one organic material that changes conductivity with the application of an electric field. Gudensen et al. U.S. Pat. No. 6,055,180 describes organic passive element arrays and is also hereby incorporated herein by reference. Memory cells comprising materials such as phase-change materials and amorphous solids can also be used. See Wolstenholme et al. U.S. Pat. No. 5,751,012 and Ovshinsky et al. U.S. Pat. No. 4,646,266, both of which are hereby incorporated herein by reference. Memory cells comprising resistance change materials including Transition Metal Oxides, as described in more detail in Herner, et al. U.S. Patent Publication No. 2007/0114508, which is hereby incorporated herein by reference, and Carbon Nano Tube layers, which may be formed as described in Sen et al. U.S. Patent Publication No. 2005/0269553, which is hereby incorporated herein by reference, can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in Scheuerlein U.S. Pat. No. 6,618,295, and in Kleveland et al. U.S. Pat. No. 6,631,085, which are both hereby incorporated herein by reference in their entirety.

In the above description, an array line is generally shared by two levels of the memory array (e.g., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be represented as horizontal lines) and Y-lines (e.g., which may be represented as vertical lines) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art and the present invention is intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (e.g., multi-level) memory array, an adjacent memory plane may be connected similarly (e.g., a back-to-back diode stack memory array as described in Johnson, et al. U.S. Pat. No. 6,034,882, referred to and previously incorporated above), or may reverse the directionality of memory cells in the adjacent plane (e.g., a serial chain diode stack memory array as described in Kleveland et al. U.S. Pat. No. 6,631,085, referred to and previously incorporated above) so that the anode terminals are connected to bit lines and the cathode terminals to word lines. Consequently, the designations of X-lines, word lines, and row lines, and of Y-lines, bit lines, and column lines are merely illustrative of the various embodiments and should not be viewed in a restrictive sense, but rather in a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (e.g., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array may be a monolithic integrated circuit structure, rather than more than one integrated circuit device packaged together or in close proximity, or die-bonded together.

The foregoing detailed description illustrates only a few of the many possible implementations of the present invention. For this reason, the above detailed description is intended to merely be illustrative and not to be limiting. Variations and modifications of the embodiments disclosed herein may be made based on the above description as well as generally well known principles, without departing from the scope and spirit of the invention. It is only the following claims, including all equivalents, which are intended to define the scope of this invention.

The invention claimed is:

1. A memory integrated circuit ("IC") comprising:
    a control circuit that provides a first output signal when a temperature of the memory IC is above a predetermined temperature, and a second output signal when the temperature of the memory IC is below the predetermined temperature;
    a heating element adapted to heat the memory IC when the control circuit provides the second output signal; and
    a memory cell comprising a diode designed to operate above the predetermined temperature.

2. The memory IC of claim 1, wherein the control circuit comprises a temperature transducer that provides an output signal proportional to temperature.

3. The memory IC of claim 2, wherein the temperature transducer comprises one or more of a current output temperature sensor, a voltage output sensor, a Brokaw cell, a bi-polar junction transistor-based temperature sensor, a thermocouple, a resistance temperature device, and a thermistor.

4. The memory IC of claim 2, wherein the control circuit further comprises a resistor coupled to the temperature transducer.

5. The memory IC of claim 2, wherein the control circuit further comprises an operational amplifier having a first input terminal coupled to the temperature transducer, and a second input terminal coupled to a reference voltage.

6. The memory IC of claim 5, wherein the control circuit further comprises a resistor coupled to the first input terminal of the operational amplifier.

7. The memory IC of claim 1, wherein the heating element comprises a resistive heating element.

8. The memory IC of claim 1, wherein the heating element comprises a plurality of resistive heating elements.

9. The memory IC of claim 1, further comprising a enable/disable circuit adapted to disable the control circuit when the memory IC operates in a low power mode.

10. The memory IC of claim 1, further comprising a enable/disable circuit adapted to enable the control circuit when the memory IC operates under line power, and to disable the control circuit when the memory IC operates under battery power.

11. The memory IC of claim 1, further comprising a enable/disable circuit adapted to enable the control circuit when the memory IC: (1) exhibits a predetermined number of read errors; (2) operates in an error recovery mode; and/or (3) operates in a safe mode.

12. The memory IC of claim 1, further comprising a circuit adapted to delay access to the memory IC until the memory IC operates in a predetermined temperature range.

13. The memory IC of claim 1, wherein the memory IC comprises a three-dimensional memory array.

* * * * *